United States Patent
Staszewski et al.

(10) Patent No.: US 7,567,138 B2
(45) Date of Patent: Jul. 28, 2009

(54) SINGLE-ELECTRON INJECTION/EXTRACTION DEVICE FOR A RESONANT TANK CIRCUIT AND METHOD OF OPERATION THEREOF

(75) Inventors: Robert B. Staszewski, Garland, TX (US); Renaldi Winoto, Albany, CA (US); Dirk Leipold, Igis (CH)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 11/846,987

(22) Filed: Aug. 29, 2007

(65) Prior Publication Data

US 2008/0061892 A1 Mar. 13, 2008

Related U.S. Application Data

(60) Provisional application No. 60/823,787, filed on Aug. 29, 2006.

(51) Int. Cl.
*H03K 3/313* (2006.01)
*H03B 5/12* (2006.01)

(52) U.S. Cl. .................. 331/107 T; 331/167; 331/158; 331/172

(58) Field of Classification Search .......... 331/55, 331/117 R, 117 FE, 116 R, 116 FE, 107 T, 331/158, 167, 172, 173, 182, 107 S
See application file for complete search history.

(56) References Cited

U.S. PATENT DOCUMENTS

| 6,373,342 B1* | 4/2002 | Tran ............................. 331/57 |
| 7,067,341 B2* | 6/2006 | Mascolo et al. ............... 438/48 |
| 2007/0263432 A1* | 11/2007 | Pertti et al. ................. 365/162 |

FOREIGN PATENT DOCUMENTS

JP 2000269478 A * 9/2000

OTHER PUBLICATIONS

Zhang et al., "A Novel Hybrid PLL Frequency Synthesizer Using Single Electron and MOS Transistors", Nanotechnology, 2006. IEEE-NANO 2006. Sixth IEEE Conference on, vol. 2, Jun. 17-20, 2006, pp. 473-476.*
Cheng et al., "SPICE Implementation of a Compact Single Electron Tunneling Transistor Model", Nanotechnology, 2004. 4th IEEE Conference on, Aug. 16-19, 2004, pp. 392-395.*
Likharev, "Single-Electron Devices and Their Applications", Proceedings of the IEEE, vol. 87, Issue 4, Apr. 1999, pp. 606-632.*

* cited by examiner

*Primary Examiner*—Robert Pascal
*Assistant Examiner*—Ryan J. Johnson
(74) *Attorney, Agent, or Firm*—Ronald O. Neerings; Wade James Brady, III; Frederick J. Telecky, Jr.

(57) ABSTRACT

A system for reducing phase-noise in a resonant tank circuit. The system includes a single-electron device configured to inject a single electron into the oscillator circuit tank circuit. The system further includes a synchronizer coupled to the single-electron device and configured to cause the single-electron device to inject the single electron into the resonant tank circuit at a phase based on an extreme (maximum or minimum) electrical characteristic output of the resonant tank circuit.

34 Claims, 4 Drawing Sheets

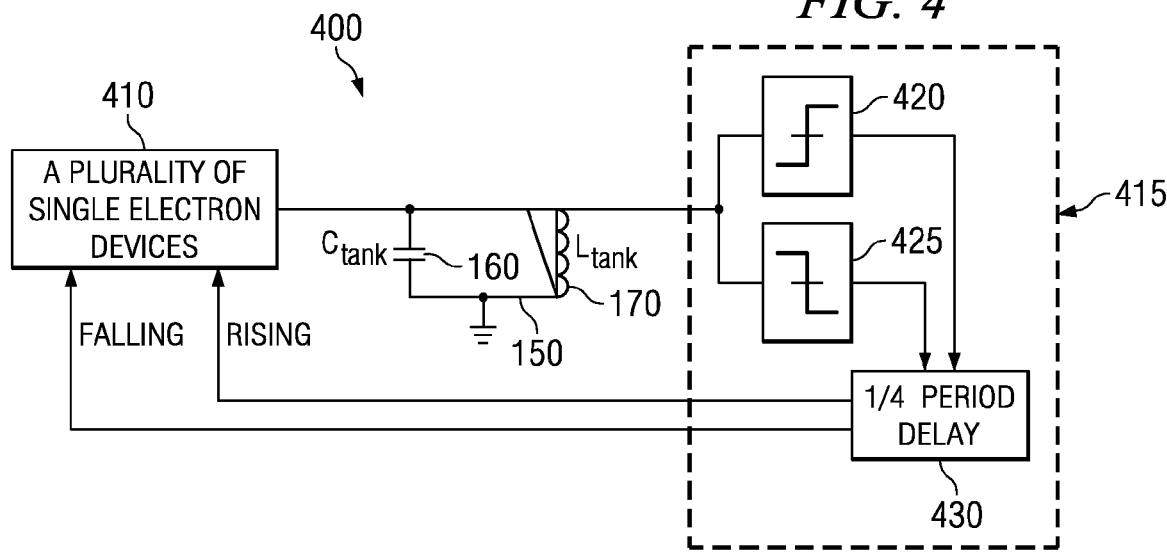
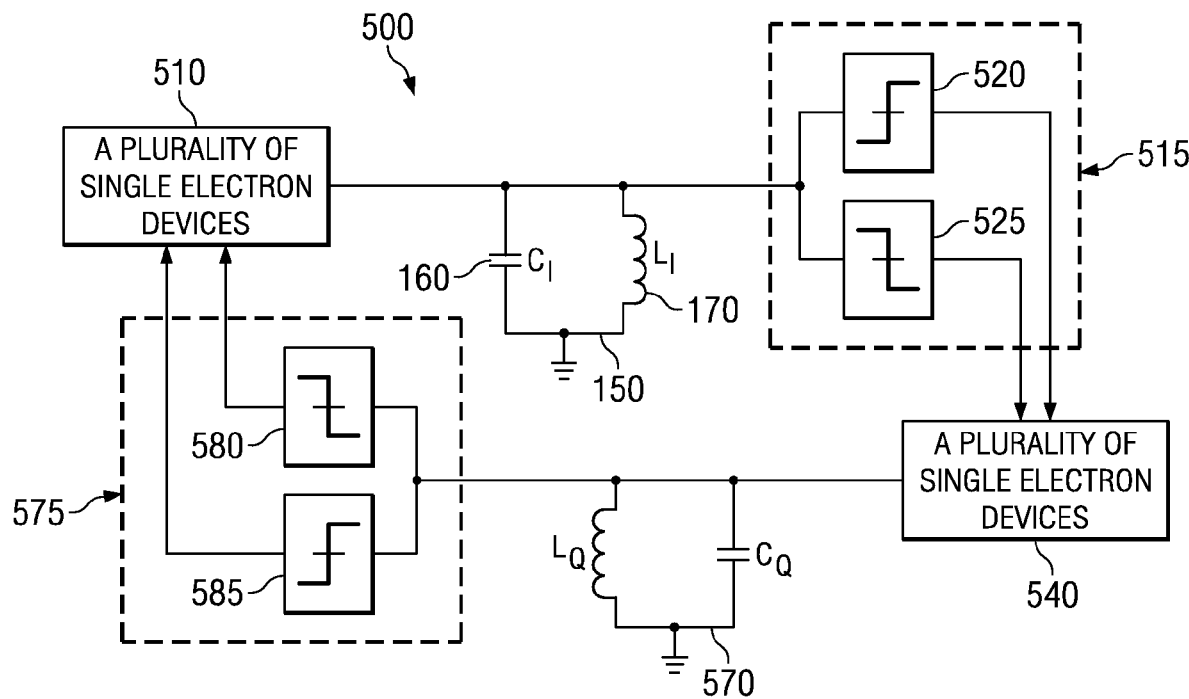

SINGLE-ELECTRON INJECTION/EXTRACTION DEVICE FOR A RESONANT TANK CIRCUIT AND METHOD OF OPERATION THEREOF

CROSS-REFERENCE TO RELATED APPLICATIONS

This Application claims the benefit of U.S. Provisional Application Ser. No. 60/823,787 filed on Aug. 29, 2006, entitled "Self-Synchronization of Oscillators with Single-Electron Restoration," commonly assigned with the present invention and incorporated herein by reference in its entirety, and is related to application Ser. No. 11/846,993, entitled "Single-Electron Tunnel Junction for a Complementary Metal-Oxide Device and Method of Manufacturing the Same" and is also related to application Ser. No. 11/847,008, entitled "A Parallel Redundant Single-Electron Device and Method of Manufacture", both to be filed concurrently herewith.

TECHNICAL FIELD OF THE INVENTION

The invention is directed, in general, to low-noise resonant tank circuits and, more specifically, to a single-electron injection/extraction device for a resonant tank circuit and a method of operating the single-electron device to increase the performance of the resonant tank circuit.

BACKGROUND OF THE INVENTION

One measure of performance of a resonant tank circuit (sometimes called a resonator), such as an inductive-capacitive ("LC") oscillator circuit, is its "phase noise" performance. "Phase noise" is generally defined as rapid, arbitrary, transient fluctuations in the phase of the wave resonating in the resonant tank circuit.

With an LC oscillator circuit, phase noise predominantly comes from two sources. First, the effective resistance within the resonator will generate thermal noise. Second, since any real-world LC oscillator circuit is always lossy, an active circuit is needed to replenish the energy resonating within the resonator such that it maintains a constant amplitude of oscillation. This active circuit can contribute thermal noise, shot noise, recombination-generation noise, flicker noise and so on to the resonator.

Flicker noise is a particular problem when the oscillator is made in a complementary metal-oxide semiconductor (CMOS) process and the active circuit for replenishing that energy takes the form of metal-oxide semiconductor (MOS) transistors coupled in a feedback configuration. MOS transistors exhibit a higher flicker noise resulting from imperfections in the manufacturing process, in which electron traps are formed in the silicon to silicon-dioxide interface.

What is needed in the art is a method and a system to replenish stored energy into a resonant tank circuit that addresses at least some of the concerns of the prior art.

SUMMARY OF THE INVENTION

To address the above-discussed deficiencies of the prior art, one aspect of the invention provides a system for reducing phase-noise in a resonant tank circuit. In one embodiment, the system includes: (1) an single-electron device configured to inject or extract a single electron into the resonant tank circuit and (2) a synchronizer coupled to the single-electron device and configured to cause the single-electron device to either inject or extract the single electron into the resonant tank circuit at a phase based, respectively, on an extreme (i.e., maximum or minimum) electrical characteristic output of the resonant tank circuit.

Another aspect of the invention provides a system for reducing phase-noise in a resonant tank circuit. One embodiment of the system includes: (1) a first resonant tank circuit, (2) a first single-electron device coupled to the first resonant tank circuit, (3) a first rising zero crossing detector coupled to the first resonant tank circuit, (4) a first falling zero crossing detector coupled to the first resonant tank circuit, (5) an electron device that is triggered by an output of the rising and falling zero crossing detector, (6) a second resonant tank circuit coupled to the electron injector and extractor, (7) a second rising zero crossing detector coupled to the first resonant tank circuit and (8) a second falling zero crossing detector coupled to the first resonant tank circuit wherein the first single-electron device is triggered by an output of the second rising and falling zero crossing detector.

Yet another aspect of the invention provides a method for reducing phase-noise in a resonant tank circuit. One embodiment of the method includes: (1) determining a minimum electrical characteristic output of the resonant tank circuit and (2) injecting an electron into the resonant tank circuit at the minimum electrical characteristic output.

Yet another aspect of the invention provides an oscillator system. One embodiment of the system includes (1) a resonant tank circuit, (2) a synchronizer coupled to the resonant tank circuit, and (3) a single-electron device coupled to the synchronizer for injecting a charge into or extracting said charge from the resonant tank circuit.

Yet another aspect of the invention provides an oscillator system. One embodiment of the system includes (1) a plurality of resonant tank circuits, (2) at least one synchronizer coupled to the plurality of resonant tank circuits, and (3) a plurality of single-electron devices coupled to said at least one synchronizer to inject charge into or extract charge from the plurality of resonant tank circuits.

Yet another aspect of the invention provides a communication device. One embodiment of the communication devices includes (1) a radio frequency transceiver, and (2) a single electron device oscillation circuit that generates an oscillating signal for the radio frequency transceiver.

BRIEF DESCRIPTION OF THE DRAWINGS

For a more complete understanding of the invention, reference is now made to the following descriptions taken in conjunction with the accompanying drawings, in which:

FIG. 4 illustrates a block diagram of one embodiment of a single-electron injector and extraction circuit employing self-synchronization and constructed according to the principles of the invention;

FIG. 5 illustrates a block diagram of one embodiment of a single-electron injection and extraction circuit employing self-synchronization using quadrature oscillator circuits and constructed according to the principles of the invention;

DETAILED DESCRIPTION

Figure 1:
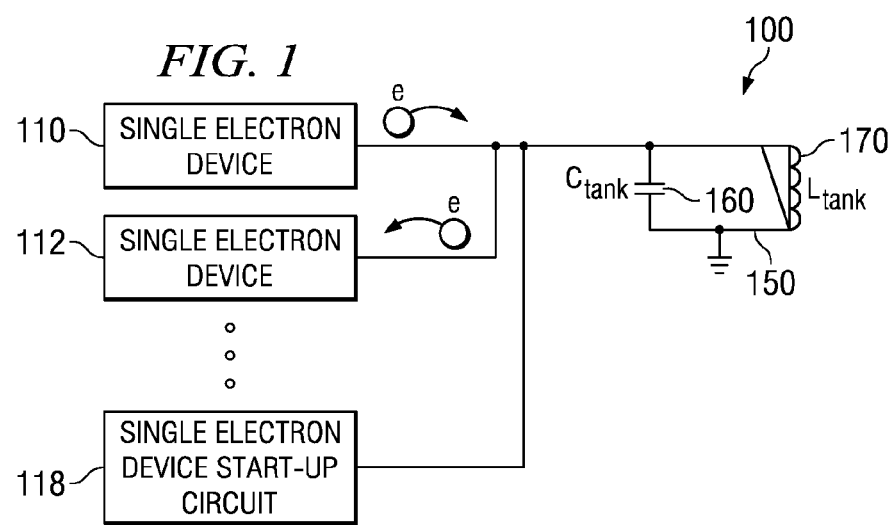
FIG. 1 illustrates a block diagram of one embodiment of a single-electron device circuit with a plurality of single-electron devices and constructed according to the principles of the invention.

FIG. 1 illustrates one embodiment of a system 100 for reducing phase-noise in a resonant tank circuit 150. The system 100 has a single-electron device 110 that is configured to inject a single electron into a resonant tank circuit 150. The resonant tank circuit 150 has a capacitor ("Ctank") 160 and an inductor ("Ltank") 170, coupled in parallel. The injection of the single electron occurs substantially at a phase corresponding to a minimum electrical characteristic output of the resonant tank circuit 150, as will be discussed below.

The single-electron device 110 can also extract a single electron from the resonant tank circuit 150. In the illustrated embodiment of FIG. 1, the system 100 also has a single-electron device 112 coupled in parallel with the single-electron device 110 and to the resonant tank circuit 150. In FIG. 1, there are a number of other single-electron devices also coupled in parallel with the single-electron device 112. The single-electron device 112 is also commonly referred to as a single electron tunnel-junction. In the illustrated embodiment, the injection or extraction of a single electron from the resonant tank circuit 150 occurs through the mechanism of quantum-mechanical tunneling and subsequent Coulomb blocking, of which those skilled in the pertinent art are aware. In further embodiments, each single electron device 110, 112, and so on, can be also configured to inject or extract a multiple (small integer) number of electrons.

Generally, in the system 100, the single-electron device 110 generates a current pulse substantially at the peak of the oscillation waveform by directly injecting (or extracting) electrons from the resonant tank circuit 150. Positive and negative current pulses are advantageously generated by extracting or injecting single electrons from the resonant tank circuit 150 respectively. As will be discussed below, if these current pulses can be synchronized with the peaks or troughs of an oscillation waveform of the resonant tank circuit 150, substantially minimum phase noise would be introduced into the system 100.

The system 100 recognizes that thermal and flicker noises are transformed into "phase noise" at an output waveform, such as may be measured as a voltage signal across Ctank 160. Generally, excess phase noise generated due to external perturbation, such as may occur when energy is introduced into the resonant tank circuit 150, is a strong function of the time at which this perturbation (i.e., thermal noise or "flicker" noise) occurs. Flicker noise may be generally known as "1/f" or "pink" noise. Flicker noise is a noise process in which the spectral energy density is proportional to the reciprocal of the frequency.

Figure 2:
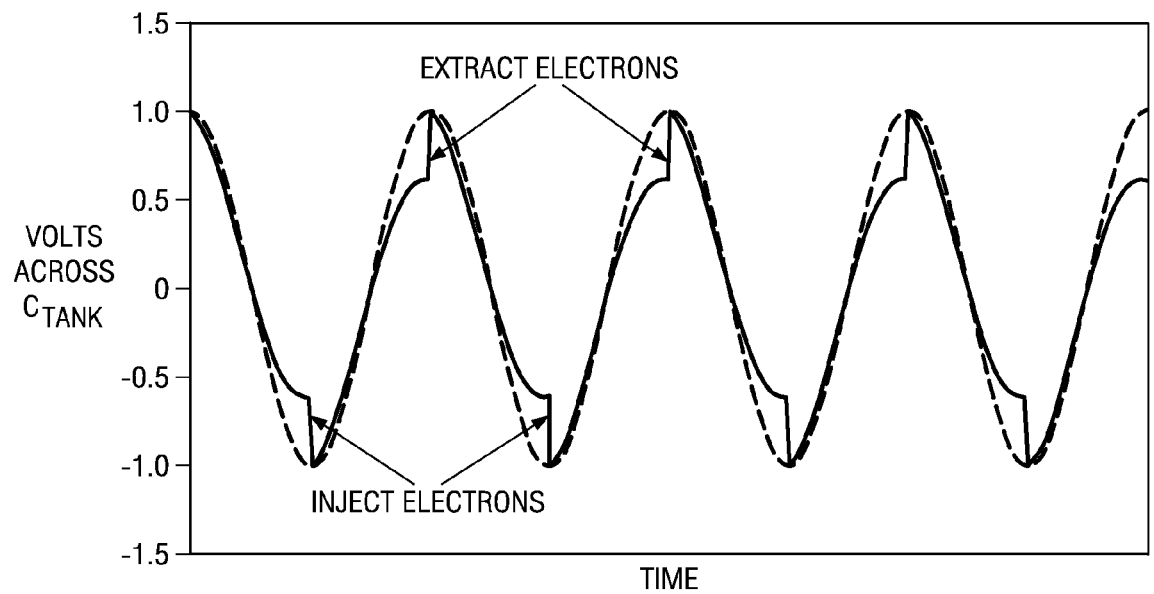
FIG. 2 illustrates a graph detailing single-electron injection and extraction in one embodiment of a resonator.

Because a given resonator is inherently lossy, having some form of potentially noisy active element is generally unavoidable in order to maintain the oscillation. However, with employment of the single-electron device 110, phase noise can be significantly reduced. Generally, because the single-electron device 110 injects or extracts electrons only at the peaks of the oscillations of the resonant tank circuit 150, the detrimental effect of noise associated with the single-electron device 110, an active element, is minimized as it affects the resonant tank circuit 150 only at its least sensitive moments. FIG. 2 illustrates this point. In the system 100, the single-electron device 110 is used because it enables good control of the time an electron (in itself a current impulse or charge packet), is introduced into the resonant tank circuit 150.

In some embodiments, the number of electrons introduced to the resonant tank circuit 150 per oscillation period can be controlled by a plurality of electron injectors 110, 112, to 118 coupled in parallel. Each single-electron device 110, 112, to 118 is configured to inject a single electron into the oscillator circuit tank circuit 150 concurrently. Each single-electron device 110, 112 to 118 is also configured to extract a single electron from the oscillator circuit tank circuit 150 concurrently. In some embodiments, there may be many thousands of single-electron devices 110, 112 to 118 coupled in parallel to the resonant tank circuit 150. At a given time, a select number of these parallel devices can be activated selectively.

In some embodiments, the single-electron device 118 is a start-up device. Generally, start up devices 118 initializes an oscillation of the resonant tank circuit 150. As will be explained below, the resonant tank circuit 150 is not as sensitive to phase noise as compared to after an initial start-up period.

Amplitude control can be achieved by activating the correct number of single-electron devices to counteract the loss of energy per period in the resonator. Exact amplitude control is not necessary in this system. Since the system consists of only a resonator and an impulsive source, both of which are substantially linear, there is no amplitude- to phase-modulation conversion. Therefore, a slight variation in the amplitude of oscillation should have no adverse effect towards the phase noise performance of the system. In some further embodiments, a power meter or peak meter can be used to estimate and determine the number of single-electron devices that are needed to be activated at a given time to compensate for a given loss.

Two advantages may result from using a single-electron device 110 in the resonant tank circuit 150. First, by being able to generate and synchronize a narrow-current pulse with the oscillation waveform of the resonant tank circuit 150, any phase noise introduced by this oscillation restoration mechanism, the narrow current pulse, is held to a low level. Second, the single-electron device 110 only dissipates energy during the switching instants with no quiescent power consumption. The system 100 is therefore able to generate thin current pulses with a minimum amount of dissipated energy.

In some embodiments, low current consumption is another feature of the system 100. Both low phase noise and low current consumption characteristics could be traded off against one another in designing the system 100. For example, a lower oscillating amplitude typically means lower current consumption, but worse phase noise. However, in some circumstances, such as during start-up by the start up device 118, worse phase-noise may be acceptable.

FIG. 2 illustrates a graph of a varying voltage amplitude value over time. In FIG. 2, the dotted line represents a voltage associated with an ideal lossless resonant tank circuit, given as a reference. The solid line represents the actual voltage output, as measured across capacitor Ctank, associated with a lossy resonant tank circuit 150.

As is illustrated, electrons are injected and extracted at the low and high peaks of the actual voltage output associated with the resonant tank circuit 150 in order to counteract the loss within the resonator. Because the electrons are injected and extracted at or close to the lowest and highest peaks of the waveform, the period of oscillation substantially follows that of an ideal lossless resonator at all times. This can be witnessed by the fact that all zero-crossings of both waveforms coincide with each other. Because of this reason, no appreciable additional phase noise is introduced if the process shown is employed.

As is illustrated in FIG. 2, the single-electron device 110 can be used to inject and extract an electron from the oscillator circuit 150, at the desired time instants. Furthermore, use of single-electron injectors 110, 112, etc. allow for injection and extraction of single electrons, a granular approach to avoiding noise associated with amplitude to phase modulation.

It should be noted that, in some embodiments, it is advantageous to inject or extract electrons at zero crossings or at points other than the extreme voltages of the oscillating wave. In these embodiments, the phase of the oscillating waveform will be changed. If the number of injected/extracted electrons is controlled (in addition to the timing control), then the phase shift will also be controlled. The controlling of an injection or extraction of electrons could be used to perform phase modulation (PM), and could be independent or in conjunction with employment of the method of FIG. 7.

Figure 3:
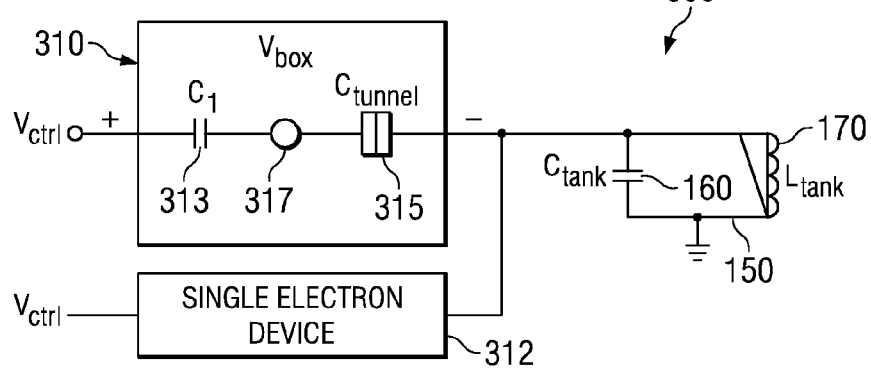
FIG. 3 illustrates a block diagram of another embodiment of a single-electron injection and extraction circuit having a plurality of single-electron devices and constructed according to the principles of the invention.

FIG. 3 illustrates one embodiment of a system 300 for reducing phase noise with a single-electron device 310. In the illustrated embodiment, the single-electron device 310 includes a small capacitor C1 313 coupled in series with a single-electron tunneling junction Ctunnel 315. Generally, the voltage across Ctunnel 315 and capacitor C1 313 would determine whether a single electron will tunnel into or out of the resonant tank circuit 150.

In the system 300, the series configuration of the tunneling junction 315 and the small capacitor 313 may be referred to as an "electron box," and is used in creating the single-electron device 310. The node between C1 313 and Ctunnel 315, a node 317, is referred to as an "island node," because it is isolated from other nodes by C1 313 and Ctunnel 315. The single-electron device 310 may be controlled by changing the voltage input "Vctrl" at an input to the single-electron device 310, which would effectively change the voltage across the single-electron device 310, the voltage denoted "Vbox." By changing the voltage Vbox, the tunneling of an electron from the resonant tank circuit 150 to the capacitor C1 320 at the island node 315, or vice versa, may be controlled. The single-electron device 310 may also be deactivated from the circuit by applying the appropriate voltage "Vctrl" such that the voltage "Vbox" is maintained at zero. A number of other single-electron devices, such as single-electron devices 312 also coupled in parallel with single-electron device 310, are also illustrated.

In the illustrated embodiment of FIG. 3, if the single-electron devices 310, 312, and other single single-electron devices (not illustrated) are triggered absolutely simultaneously, a resulting current pulse would be infinitely thin. In reality, quantum tunneling is a random phenomenon; in particular, the waiting time for a quantum tunnel event to occur is an exponentially distributed random variable. Advantageously, for at least some embodiments of device dimensions of single-electron devices 310, 312, an average of the waiting time distribution is in the picosecond range. If numerous of these single-electron devices 310, 312 are put in parallel and operated simultaneously, the resulting current pulse would still be narrow, (i.e., should have a width variation measurable in picoseconds) which advantageously can lead to a lessening of phase noise, especially when combined with proper timing of the injection or extraction of the electrons.

For ease of understanding, an example of a hypothetical determination follows below, of a calculation of a quantity of these single-electron devices 310 are needed in order to perpetuate a substantially constant voltage amplitude oscillation within the resonant tank circuit 150.

Suppose that the resonant tank circuit 150 has of a 1 picofarad "Ctank" 160 coupled in parallel with a 1 nanohenry inductor "Ltank" 170. The natural frequency of this resonant tank circuit 150 would be around 5 gigahertz. In the hypothetical determination, the "Q"-value of the inductor is 10. This means that the resonant tank circuit 150 only retains 90% of its initial energy after one oscillation period. In other words, the tank capacitance "Ctank" only retains 95% of its charge after a single oscillation period. If the oscillation amplitude of the resonant tank circuit 150 is 0.5 volts, the full-scale output would correspond to a charge equals to 3.125 million electrons. Thus the charge lost in each period is equivalent to 156,250 electrons. Since the single-electron devices 310 operates twice in a cycle, only half of that number, or 78,125 single-electron devices are needed to perpetuate the oscillation. In at least some embodiments, a given number of single-electron devices may be enough to sustain or perpetuate an oscillation, but even more single-electron devices would be needed to initiate the oscillation.

In the illustrated embodiment of FIG. 3, the area of a single-electron box 310 is roughly the same as the area of a minimum-sized NMOS transistor. In a further embodiment, the number of single-electron devices 310 can be significantly reduced if the resonant tank circuit 150 is operated at a higher frequency, in which a smaller capacitance for Ctank 160 can be used, or if the inductor has a higher "Q" value which would result in a lower energy loss per cycle.

FIG. 4 illustrates a system for reducing phase noise 400 that employs delay-line self-synchronization. Generally, a synchronization mechanism can be employed to control a timing of a plurality of single-electron devices 410, such that electrons are injected or extracted at the desired time interval within the oscillation period of the resonant tank circuit 150. The plurality of single-electron devices 410 may comprise a bank of single-electron devices. The plurality of single-electron devices 410 may be coupled in parallel.

System 400 injects and extracts electrons when the phase noise response of the resonant tank circuit 150 is near the zero crossings, which would introduce the least amount of excess phase noise to the resonant tank circuit 150. The points where the phase response is equal to zero corresponds to the top and the bottom part of the output waveform of the resonant tank circuit 150. Generally, the electron injection system 400 uses an output waveform of the resonant tank circuit 150 to synchronize the plurality of single-electron devices 410.

The system 400 has the plurality of single-electron devices 410 that is configured to inject a single electron into the oscillator resonant tank circuit 150 having the Ctank 160 and the Ltank 170, coupled in parallel. The injection of the single electron occurs substantially at a phase corresponding to a minimum electrical characteristic output of the resonant tank circuit 150, as discussed above. In at least some embodiments, the plurality of single-electron devices 410 can also extract an electron from the resonant tank circuit 150, at the maximum electrical characteristic output of the resonant tank circuit 150. These minimum and maximum voltage characteristics can be voltage measurements. The injection or extraction of the electron occurs through the mechanism of quantum tunneling.

As discussed above, an electron injector, such as the single-electron device 410, could be activated at the peaks of the oscillation waveform. The peaks also include the relative lowest parts of the oscillation waveform. In some embodiments, a peak detector can be used in order to accomplish this goal. Nevertheless, depending upon a given oscillation frequency, detecting the zero-crossings of the oscillation of the resonant tank circuit 150 may be preferred than detecting the peaks of the oscillation of the resonant tank circuit 150.

This may be because, in some embodiments, detecting a zero-crossing is easier to do than detecting a peak of a waveform. For example, for detecting a zero-crossing, a differential comparator or comparator may be used, and then it is noted when an output of the zero-comparator toggles from low to high, and vice versa. For peak detection, however a tally/memory is needed, in order to determine a maximum or minimum of an output voltage. However, in some embodiments, a single-electron device that uses a zero crossing detector should be augmented with a quarter period delay line, to be able to correctly synchronize the injection/extraction of electrons with the oscillation period.

In the system 400, the zero-crossings are detected, and then are compensated for by a time delay of ¼ period of the oscillation of the resonant tank circuit 150 before injecting or extracting an electron by the single-electron device 410.

The output of the resonant tank circuit 150 is coupled to a synchronizer 415. The synchronizer 415 includes a rising zero crossing detector 420 and a falling zero crossing detector 425. Whenever the output, such as a voltage amplitude, of the resonant tank circuit 150 crosses zero, either the detectors 420 and 425 will signal, as appropriate.

The synchronizer 415 includes a delay element 430. The detectors as coupled to a ¼ period delay element 430. The delay element 430 delays a zero-crossing signal from the elements 420, 425 by one quarter of a period of the sinusoidal output of the resonant tank circuit 150. Through this delay, the zero-crossing signal is delayed to correspond with a peak (including a trough) of the voltage output sinusoid of the resonant tank circuit 150. Therefore a falling zero-crossing edge would trigger an electron injection ¼ of a period later, and a rising zero-crossing edge would trigger an electron extraction ¼ of a period later.

In some embodiments, the zero-crossing detectors 420, 425 can be magnetically coupled to the oscillator. The magnetic coupling can aid in avoiding parasitic capacitance which may be associated with some embodiments of zero-crossing detectors 429, 425.

The delay element 430 can be implemented in multiple ways. An all-digital delay element 430, utilizing the delays of a chain of inverters, is one embodiment. In some embodiments, where a resulting time delay of a time of a chain of inverters may not have sufficient temporal resolution, a secondary continuously-tunable delay line can be added.

These delayed zero-crossing signals are then conveyed to the plurality of single-electron devices 410, which injects or extracts an electron, as appropriate. When receiving the delayed rising zero-crossing signal, the single-electron device 410 extracts an electron. When receiving the delayed falling zero-crossing signal, the plurality of single-electron device 410 injects an electron.

In alternative embodiments, the functionality of the zero-crossing detectors 420 and 425 with the delay circuit 430 may be realized through other circuits and systems. These other circuits or systems would contain a generalized level-crossing detector and an adjustable delay. A certain combination of the level value for the detector and the delay may be brought to an acceptable or optimal value through performance monitoring of the generated signal. In these circuits and systems, the adjustable delay value can be swept (i.e., cyclically varied between values) to find a value that produces the best overall performance.

FIG. 5 illustrates a use a periodic external source to synchronize a plurality of single-electron devices 510 in a quadrature oscillator circuit system 500. In the illustrated embodiment, the external source is a second resonant tank circuit 570, which is coupled to the first resonant tank circuit 150. The first resonant tank circuit 150 and the second resonant tank circuit 550 are in quadrature with each other (i.e., the signal outputs are separated by 90 degrees). The use of two oscillators that are in quadrature with respect to each other eliminates the need for a ¼ period delay line.

The quadrature oscillator circuit system 500 has electron injector 510 that is configured to inject a single electron into the first resonant tank circuit 150 having the $C_{tank}$ 160 and the $L_{tank}$ 170 coupled in parallel. The plurality of single-electron devices 510 can also extract electrons from the first resonant tank circuit 150. The injection or extraction of the electron occurs through the mechanism of quantum tunneling.

As discussed above, a single-electron device, such as the single-electron devices of the plurality of single electron devices 510 should be activated at the extremes (peaks and troughs) of the oscillation waveform. The output of the resonant tank circuit 150 is coupled to a rising zero crossing detector 520 and a falling zero crossing detector 525. Whenever the output, such as a voltage amplitude, of the resonant tank circuit 150 crosses zero, either one of the detectors 520 and 525 will signal, as appropriate.

These zero-crossing signals are then conveyed to a plurality of single-electron devices 540, which injects or extracts electrons, as appropriate. When receiving the rising zero-crossing signal, the plurality of single-electron devices 540 extracts an electron. When receiving the falling zero-crossing signal, the plurality of single-electron devices 540 injects an electron into the resonator circuit 570.

The plurality of single-electron devices 540 injects energy into the second resonant tank circuit 570. As discussed above, an electron injector, such as the plurality of single-electron devices 540 should be activated at the peaks or troughs of the oscillation waveform of the second resonant tank circuit 570. Note that the crossing detectors 520, 525 and the plurality of single-electron devices 540 are part of a first synchronizer 515.

The output of the second resonant tank circuit 570 is coupled to a rising zero crossing detector 580 and a falling zero crossing detector 585 of a second synchronizer 575. Whenever the output, such as a voltage amplitude, of the resonant tank circuit 570 crosses zero, either the detectors 580 and 585 will signal, as appropriate.

These zero-crossing signals are then conveyed to the electron injector 510, which injects or extracts an electron, as appropriate. When receiving the rising zero-crossing signal, the plurality of single-electron devices 540 extracts an electron. When receiving the falling zero-crossing signal, the single-electron device 510 injects an electron into the resonant tank circuit 150. As is illustrated above, use of the above quadrature configuration enables an elimination of the time delay elements of FIG. 4. In some embodiments, although FIG. 5 is illustrated as having two separate synchronizers, synchronizers 515 and 575 can be realized as a single synchronizer having multiple inputs and outputs.

In at least some embodiments, the quadrature phase relationship between the resonant tank circuit 150 and the second resonant tank circuit 150 is ensured during a start up of the quadrature oscillator circuit system 500.

Figure 6:
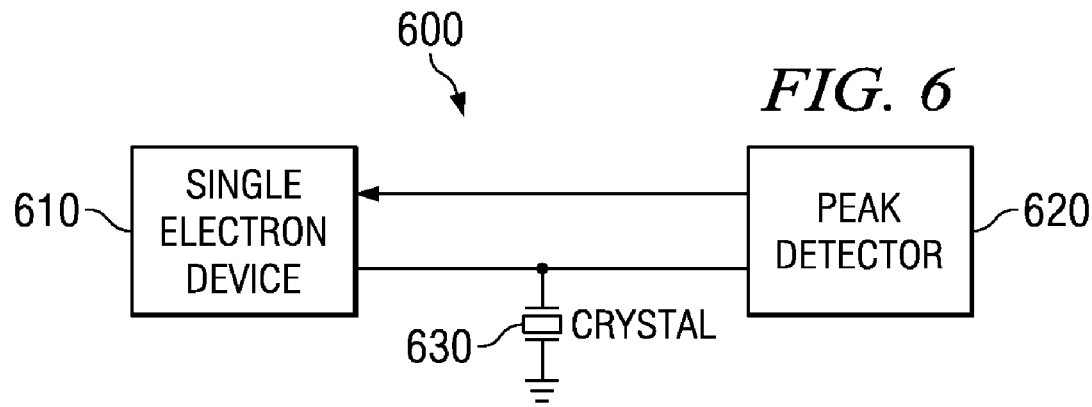
FIG. 6 illustrates a block diagram of one embodiment of a single-electron device for use with a crystal oscillator circuit and constructed according to the principles of the invention.

FIG. 6 illustrates a single-electron device 610 for use with a crystal 630 oscillator circuit of system 600 for reducing phase noise. A peak detector 620 is coupled to the crystal oscillator circuit and the plurality of single-electron device 610. The crystal oscillator circuit can also be considered as an alternative embodiment of a resonator circuit. Furthermore, due to the lower frequency of oscillation of the crystal oscillator circuit 600, the peak detector 620 can advantageously detect "peaks" of an electrical waveform, such as a voltage differential across the crystal 630. The peak detector can further comprise a trough detector.

Figure 7:
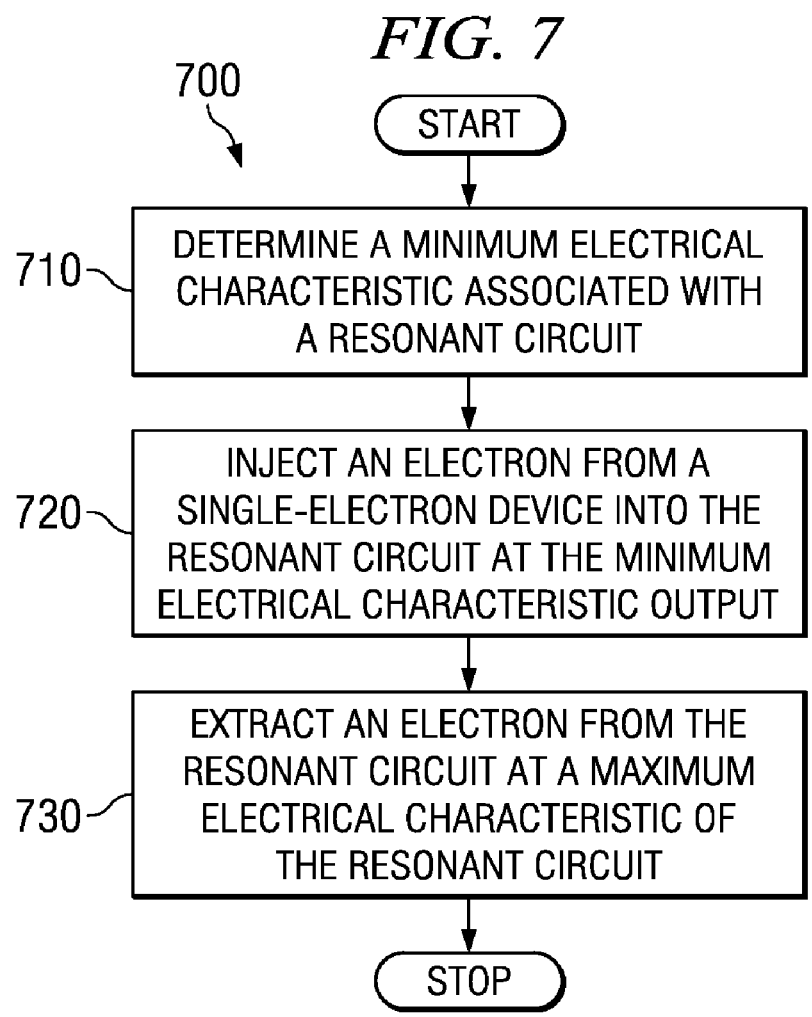
FIG. 7 illustrates a flow diagram of one embodiment of a method for injecting or extracting a single electron from a resonant tank circuit and carried out according to the principles of the invention.

FIG. 7 illustrates a method 700 for reducing phase noise. A minimum electrical characteristic output of an oscillator circuit tank circuit, such the resonant tank circuit 150, is determined in a step 710.

An electron is injected into the resonant tank circuit at the minimum electrical characteristic output by a single-electron device in step 720. An electron is extracted from the resonant tank circuit 150 at a maximum electrical characteristic output of the resonant tank circuit 150 in step 730. In some embodiments, the extraction is eliminated if there is another mechanism for a rapid extraction of electrons.

In some embodiments of the method 700, the injection of the electron into the resonant tank circuit 150 is triggered by a crossing of a zero voltage amplitude of a waveform. The waveform can be an output of the oscillator circuit tank circuit, such as the resonant tank circuit 150. In some embodiments, the injection of the electron is triggered by a delayed signal correlated to the crossing of the zero voltage amplitude.

Generally, although other approaches exist, in one aspect, an oscillation can be started within the aforementioned circuit of FIG. 1 by using the apparatus that have been described above. As described in paragraph [0023] of FIG. 1, a power meter can be used to determine the number of electron needed per period in order to perpetuate an oscillation with a certain output power. Upon power-up, no oscillation has been started within the circuit. Therefore, an output signal power is zero, or close to zero, if the noise power is accounted for. In turn, this scenario would require a large number, perhaps the maximum number provided, of single-electron devices to be activated in order to obtain a desired output power level.

In some alternative embodiments, in which a redundant array of single-electron devices is used, there are devices not normally used as they were identified as devices with non-acceptable single-electron effects. In some embodiments, an output or the state of the plurality of said single-electron devices are controlled to be active or inactive. This will allow various single-electron devices to be enabled or disabled. The single-electron device can be coupled, such as through a multiplexer.

For instance, concerning acceptable electrical single-electron effects, in one embodiment, the single-electron device gives rise to a capacitance of 0.3 attofarads. As a charge of an electron is approximately $1.6 \times 10^{-19}$ coulombs, an addition of a single electron would result in a voltage change of approximately 0.5 volts. That is an example of acceptable single-electron effect or, which has good characteristics for measuring and exploiting single-electron effects. In other embodiments, 0.1 volts may be set as a threshold. Single electron devices below this discernable threshold may be deemed unacceptable for single-electron effects. However, these voltage changes may be generally measurable above variations in background thermal noise.

Advantageously, single-electron devices deemed unacceptable for single-electron effects may be engaged during startup, and may, for example, be used in single electron device 118. In the startup interval, when the oscillator circuit just starts to oscillate with its amplitude increasing gradually from zero to some final value, the phase noise performance is not very important, but a quick startup guarantee is of significantly greater importance. In some embodiments the startup single electron device 118 can be used when the device is initiated or whenever a step to a higher oscillation voltage is required. Furthermore, using the single electron devices that are marked as unacceptable in the redundant array context does not necessarily result in any substantial additional cost.

In the presence of noise, eventually these selected single-electron devices will be triggered to cumulatively inject or extract a large number of electrons. As a result a current impulse is generated, which impinges on the resonator. This action would therefore start the oscillation within the circuit.

Figure 8:
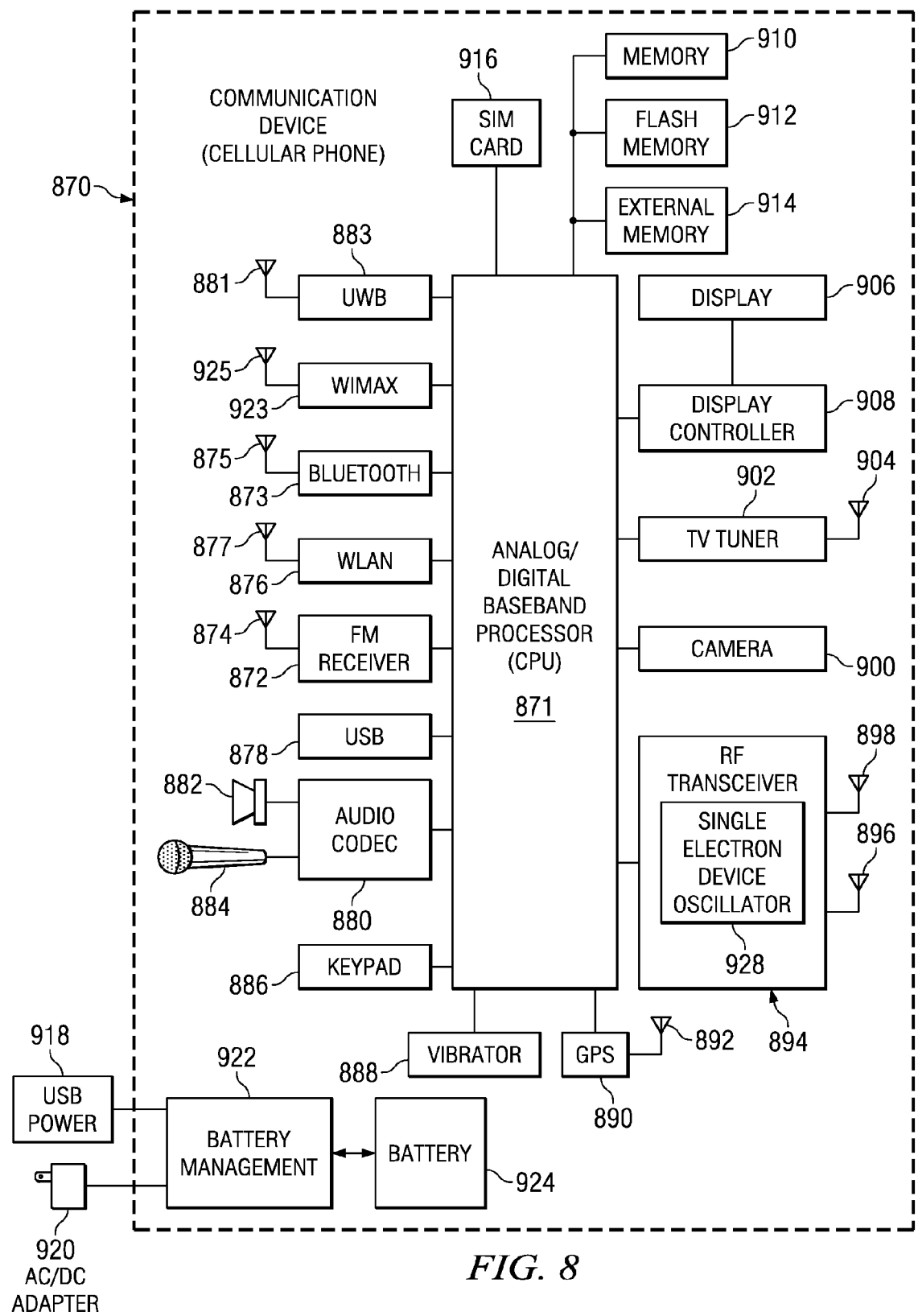
FIG. 8 illustrates simplified block diagram illustrating an example mobile communication device incorporating the single-electron device frequency oscillation and/or generation mechanism of the present invention.

FIG. 8 illustrates a simplified block diagram illustrating an example communication device 870 incorporating the single-electron device and single-electron oscillator constructed according to the principles of the present invention. The communication device may comprise any suitable wired or wireless device such as a multimedia player, mobile station, mobile device, cellular phone, PDA, wireless personal area network (WPAN) device, Bluetooth EDR device, etc. For illustration purposes only, the communication device is shown as a cellular phone or smart phone. Note that this example is not intended to limit the scope of the invention as the SED mechanism of the present invention can be implemented in a wide variety of wireless and wired communication devices.

The cellular phone, generally referenced 870, comprises a baseband processor or CPU 871 having analog and digital portions. The basic cellular link is provided by a radio frequency ("RF") transceiver 894 and related one or more antennas 896, 898. A plurality of antennas is used to provide antenna diversity which yields improved radio performance. The cell phone also comprises internal RAM and ROM memory 910, Flash memory 912 and external memory 914.

In accordance with one aspect of the present disclosure, a single electron device oscillator 928 (i.e., a single electron device used in conjunction with a resonant tank circuit) can, for example, include systems 400, 500 or 600 within the RF transceiver 894. These systems 400 or 500 include the single electron devices 110, and can also further include arrays of single electron devices, which can include thousands or tens of thousands of devices. Furthermore, a starter-circuit can be used by the communication device 870 within the RF transceiver to initiate oscillations by the tank circuit of systems 400 and 500 upon a power up, reentry from a power-down, sleep or doze modes of operation of the communication device 870.

Generally, the single electron device oscillator 928 generates an RF oscillating signal for a radio frequency transceiver (i.e., local oscillator) or a frequency reference for a local oscillator. Alternatively, the single electron device oscillator 928 could be used to generate clocks for various digital logic of the communication device 870 and the baseband processor 871.

In some embodiments, the radio frequency device includes a plurality of coupled single electron devices. An output of said plurality of said single-electron devices are controlled to be active or inactive.

Several user interface devices include microphone 84, speaker 882 and associated audio codec 880, a keypad for entering dialing digits 886, vibrator 888 for alerting a user, camera and related circuitry 900, a TV tuner 902 and associated antenna 104, display 106 and associated display controller 908 and GPS receiver 890 and associated antenna 892.

A USB interface connection 878 provides a serial link to a user's PC or other device. An FM receiver 872 and antenna 874 provide the user the ability to listen to FM broadcasts. WLAN radio and interface 876 and antenna 877 provide wireless connectivity when in a hot spot or within the range of an ad hoc, infrastructure or mesh based wireless LAN network. A Bluetooth EDR radio and interface 873 and antenna 875 provide Bluetooth wireless connectivity when within the range of a Bluetooth wireless network. Further, the communication device 870 may also comprise a WiMAX radio and interface 923 and antenna 925. SIM card 916 provides the interface to a user's SIM card for storing user data such as address book entries, etc. The communication device 870 also comprises an Ultra Wideband (UWB) radio and interface 883 and antenna 881. The UWB radio typically comprises an MBOA-UWB based radio.

Portable power is provided by the battery 924 coupled to battery management circuitry 922. External power is provided via USB power 918 or an AC/DC adapter 920 connected to the battery management circuitry which is operative to manage the charging and discharging of the battery 924.

Those skilled in the art to which the invention relates will appreciate that other and further additions, deletions, substitutions and modifications may be made to the described embodiments without departing from the scope of the invention.

What is claimed is:

1. A system for reducing phase-noise in a resonant tank circuit, comprising:
    a single-electron device configured to inject or extract a single electron into said resonant tank circuit; and
    a synchronizer coupled to said single-electron device and configured to cause said single-electron device either to inject or to extract said single electron into said resonant tank circuit at a phase based, respectively, on an extreme electrical characteristic output of said resonant tank circuit.

2. The system as recited in claim 1, wherein said extreme electrical characteristic output is a minimum electrical characteristic output of said resonator circuit.

3. The system as recited in claim 1 further comprising a plurality of single-electron devices, each of said plurality of single-electron devices configured either to inject or to extract a single electron into said resonator circuit concurrently.

4. The system as recited in claim 1 wherein said extreme electrical characteristic output is a maximum electrical characteristic output of said resonator circuit and said synchronizer is configured to cause said single-electron device to extract said single electron from said resonator circuit at a phase based on said maximum electrical characteristic output.

5. The system as recited in claim 4 wherein said extreme electrical characteristic output is a maximum voltage output of said resonator circuit.

6. The system as recited in claim 1 wherein said resonator circuit comprises a crystal oscillator circuit.

7. The system as recited in claim 1 wherein said extreme electrical characteristic output is a maximum voltage amplitude of said resonator circuit.

8. The system as recited in claim 1 wherein said extreme electrical characteristic output is a minimum voltage amplitude of said resonator circuit.

9. The system as recited in claim 1 wherein said synchronizer comprises a rising zero-crossing detector and a falling zero crossing detector.

10. The system as recited in claim 9 wherein said injection of said electron is associated with a zero crossing as determined by said synchronizer.

11. The system as recited in claim 9 wherein said synchronizer employs at least one output of said resonator circuit to determine a zero crossing.

12. The system as recited in claim 11 wherein a time of said zero crossing is delayed by one quarter of a period of said resonator circuit and then used as a trigger for said synchronizer.

13. The system as recited in claim 10 wherein said single-electron device comprises a capacitor coupled in series with a single-electron tunneling junction.

14. The system as recited in claim 13 wherein a voltage across said capacitor coupled in series with a single-electron tunneling junction determines whether an electron will tunnel into or out of said resonant tank circuit.

15. The system as recited in claim 1, wherein an injection or extraction of said single electron causes substantially a minimum amount of phase disturbance of said resonant tank circuit.

16. A system for reducing phase-noise in a resonant tank circuit, comprising:
    a first resonant tank circuit;
    a first single-electron device coupled to the first resonant tank circuit;
    a first rising zero crossing detector coupled to the first resonant tank circuit;
    a first falling zero crossing detector coupled to the first resonant tank circuit;
    a second-single electron device configured to be triggered by an output of the first rising zero crossing detector and the first falling zero crossing detector;
    a second resonant tank circuit coupled to the single-electron device;
    a second rising zero crossing detector coupled to the first resonant tank circuit; and
    a second falling zero crossing detector coupled to the second resonant tank circuit, the first single-electron device is triggered by an output of the second rising zero crossing detector and the second falling zero crossing detector.

17. The system as recited in claim 16 wherein the first single-electron device is triggered by an output of the first rising zero crossing detector and the first falling zero crossing detector.

18. A method for reducing phase-noise in a resonant tank circuit, comprising:
    determining a minimum electrical characteristic output of the resonant tank circuit; and
    injecting an electron from a single-electron device into the resonant tank circuit at said minimum electrical characteristic output.

19. The method as recited in claim 18 further comprising extracting an electron from the resonant tank circuit at a maximum electrical characteristic output of the resonant tank circuit.

20. The method as recited in claim 18 wherein the injection of the electron by the single-electron device into the resonant tank circuit is triggered by a crossing of a zero voltage amplitude of a waveform.

21. The method as recited in claim 20 wherein the waveform is an output of the resonant tank circuit.

22. The method as recited in claim 20 wherein the injection of the electron is triggered by a delayed signal correlated to the crossing of the zero voltage amplitude.

23. An oscillator system, comprising:
a resonant tank circuit;
a synchronizer coupled to said resonant tank circuit; and
a single-electron device coupled to said synchronizer for injecting a charge into or extracting said charge from said resonant tank circuit.

24. The system of claim 23, further comprising a start-up single electron device coupled to said resonant tank circuit to inject or extract a second charge when an oscillation in said tank circuit is initiated.

25. The system of claim 24, wherein said start-up single electron device is considered unacceptable when an addition of a single electron results in a voltage change of less than a threshhold value.

26. The system of claim 25, wherein a single electron device is deemed unacceptable when said single electron device changes its voltage by less than 0.10 of a Volt when either injecting or extracting an electron.

27. The system of claim 23, further comprising a plurality of single-electron devices coupled to said resonant tank circuit.

28. The system of claim 27, wherein an output of said plurality of said single-electron devices are controlled to be active or inactive.

29. The system of claim 23, wherein said resonant tank circuit is a crystal oscillator circuit.

30. An oscillator system, comprising:
a plurality of resonant tank circuits;
at least one synchronizer coupled to said plurality of resonant tank circuits; and
a plurality of single-electron devices coupled to said at least one synchronizer to inject charge into or extract charge from said plurality of resonant tank circuits.

31. A communication device, comprising:
a radio frequency transceiver; and
a single electron device coupled to said radio frequency transceiver for injecting an electron into a resonant tank circuit at a minimum electrical characteristic output of the resonant tank circuit.

32. The communication device of claim 31, wherein said radio frequency device includes a plurality of coupled single electron devices.

33. The system of claim 31, wherein said communication device is a cellular phone.

34. The system of claim 31, further comprising a synchronizer coupled to said resonant tank circuit.

* * * * *